(12) United States Patent
Bonne

(10) Patent No.: US 10,670,250 B2
(45) Date of Patent: Jun. 2, 2020

(54) CHIP-ON-BOARD MODULAR LIGHTING SYSTEM AND METHOD OF MANUFACTURE

(71) Applicant: Lumileds LLC, San Jose, CA (US)

(72) Inventor: Ronald Bonne, Plainfield, IL (US)

(73) Assignee: Lumileds LLC, San Jose, CA (US)

(*) Notice: Subject to any disclaimer, the term of this patent is extended or adjusted under 35 U.S.C. 154(b) by 0 days.

(21) Appl. No.: 16/228,022

(22) Filed: Dec. 20, 2018

(65) Prior Publication Data

US 2019/0195479 A1 Jun. 27, 2019

Related U.S. Application Data

(60) Provisional application No. 62/609,496, filed on Dec. 22, 2017.

(30) Foreign Application Priority Data

Mar. 27, 2018 (EP) .................................. 18164311

(51) Int. Cl.
*F21V 23/02* (2006.01)
*F21V 23/06* (2006.01)
(Continued)

(52) U.S. Cl.
CPC ............ *F21V 23/004* (2013.01); *F21K 9/20* (2016.08); *F21K 9/90* (2013.01); *F21V 15/01* (2013.01);
(Continued)

(58) Field of Classification Search
CPC .... F21V 23/004; F21V 23/005; F21V 23/006; F21V 23/02; F21V 23/06; F21V 29/50;
(Continued)

(56) References Cited

U.S. PATENT DOCUMENTS 9,293,672 B2    3/2016  Park et al.
9,982,876 B2*   5/2018  Li ......................... H05K 1/021
(Continued)

FOREIGN PATENT DOCUMENTS

CN    104565953       4/2015
CN    106352254 A     1/2017
(Continued)

OTHER PUBLICATIONS

Reiss et al, "Optoelectronic Assembly and Method for Producing an Optoelectronic Assembly", Patent Translate Powered by EPO and Google, DE102013204862-A1, Oct. 9, 2014, 39 pages.*

*Primary Examiner* — Alan B Cariaso
(74) *Attorney, Agent, or Firm* — Volpe and Koenig, P.C.

(57) ABSTRACT

Chip-on-board (COB) modular lighting systems and methods of manufacture are described herein. A system includes a COB assembly including a thermally conductive plate and a COB light-emitting diode (LED) device thermally coupled to the thermally conductive plate. The COB LED device includes multiple LED chips disposed on a surface of a substrate. The substrate includes first electrical power contacts exposed from at least the surface. The system further includes an electronics board that has second electrical power contacts. The electronics board is attached to the COB assembly such that the first and second electrical contacts are electrically coupled and the thermally conductive plate is attached to the electronics board.

20 Claims, 11 Drawing Sheets

(51) Int. Cl.
- *F21V 29/50* (2015.01)
- *H05B 33/08* (2020.01)
- *H05K 1/18* (2006.01)
- *H05K 7/20* (2006.01)
- *F21V 23/00* (2015.01)
- *F21K 9/90* (2016.01)
- *F21V 15/01* (2006.01)
- *F21K 9/20* (2016.01)
- *F21V 29/70* (2015.01)
- *H05B 45/10* (2020.01)
- *H05B 47/18* (2020.01)
- *F21Y 115/10* (2016.01)
- *H05B 45/00* (2020.01)

(52) U.S. Cl.
CPC ............ *F21V 23/006* (2013.01); *F21V 23/02* (2013.01); *F21V 23/06* (2013.01); *F21V 29/50* (2015.01); *F21V 29/70* (2015.01); *H05B 45/10* (2020.01); *H05B 47/18* (2020.01); *H05K 1/182* (2013.01); *H05K 7/20509* (2013.01); *F21Y 2115/10* (2016.08); *H05B 45/00* (2020.01); *H05K 2201/09027* (2013.01); *H05K 2201/1025* (2013.01); *H05K 2201/10106* (2013.01); *H05K 2201/10568* (2013.01)

(58) Field of Classification Search
CPC ..... F21V 29/503; F21V 29/508; H05K 1/142; H05K 1/144
See application file for complete search history.

(56) References Cited

U.S. PATENT DOCUMENTS

| | | | |
|---|---|---|---|
| 2012/0293997 A1 | 11/2012 | Zaderej | |
| 2013/0265779 A1 | 10/2013 | Scordino et al. | |
| 2015/0021629 A1* | 1/2015 | Gershowitz | H05B 33/0842 257/88 |
| 2016/0201889 A1* | 7/2016 | Liu | F21V 17/14 362/294 |
| 2017/0311422 A1* | 10/2017 | Arai | H04R 1/028 |
| 2018/0145059 A1 | 5/2018 | Welch et al. | |
| 2019/0008045 A1* | 1/2019 | Iedema | H05K 1/142 |

FOREIGN PATENT DOCUMENTS

| | | |
|---|---|---|
| DE | 102010043220 | 5/2012 |
| DE | 102013204862 A1 | 10/2014 |
| EP | 3009731 A1 | 4/2016 |
| WO | 2010/060420 | 6/2010 |
| WO | 2015/130788 A1 | 9/2015 |
| WO | 2016/020446 | 2/2016 |

\* cited by examiner

CHIP-ON-BOARD MODULAR LIGHTING SYSTEM AND METHOD OF MANUFACTURE

CROSS REFERENCE TO RELATED APPLICATIONS

This application claims the benefit of U.S. Provisional Application 62/609,496 filed Dec. 22, 2017 and European Patent Application No. 18164311.5 filed Mar. 27, 2018, the contents of which are hereby incorporated by reference herein as if fully set forth.

BACKGROUND

Chip-on-board (COB) light emitting diode (LED) devices include multiple LED chips bonded to a substrate to form a single module. Since the individual LEDs used in a COB LED module are low profile chips, they can be mounted to take up less space than more conventionally packaged LEDS (e.g. using surface mounted device (SMD) packaging).

SUMMARY

Chip-on-board (COB) modular lighting systems and methods of manufacture are described herein. A system includes a COB assembly including a thermally conductive plate and a COB light-emitting diode (LED) device thermally coupled to the thermally conductive plate. The COB LED device includes multiple LED chips disposed on a surface of a substrate. The substrate includes first electrical power contacts exposed from at least the surface. The system further includes an electronics board that has second electrical power contacts. The electronics board is attached to the COB assembly such that the first and second electrical contacts are electrically coupled and the thermally conductive plate is attached to the electronics board.

DETAILED DESCRIPTION OF THE PREFERRED EMBODIMENTS

Figure 1A:
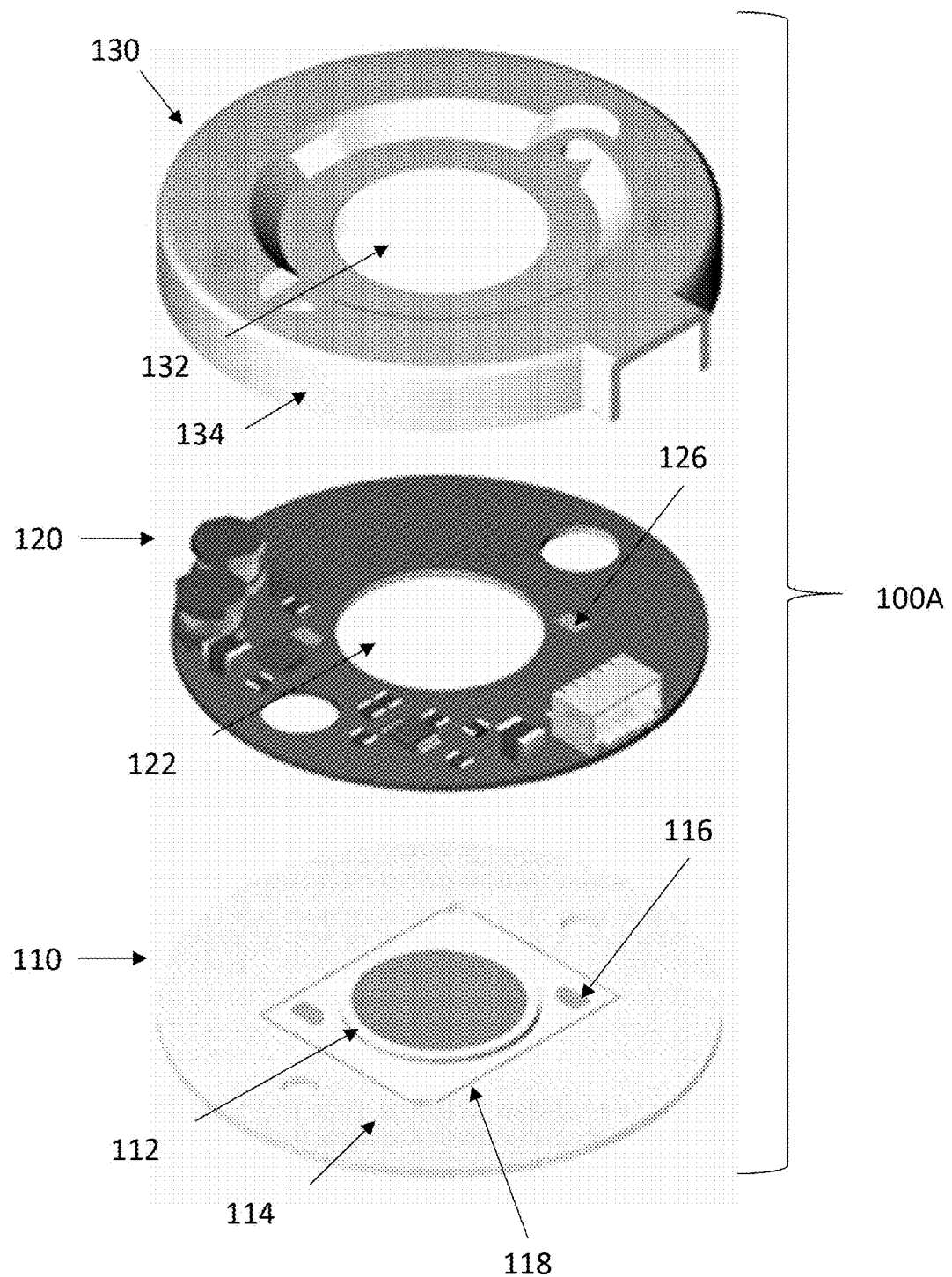
FIG. 1A is an exploded view a Chip-on-Board (COB) light emitting diode (LED) device lighting system.

Examples of different light illumination systems and/or light emitting diode (LED) implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Further, whether the LEDs, LED arrays, electrical components and/or electronic components are housed on one, two or more electronics boards may also depend on design constraints and/or application.

Semiconductor LEDs or optical power emitting devices, such as devices that emit ultraviolet (UV) or infrared (IR) optical power, are among the most efficient light sources currently available. These devices (hereinafter "LEDs" and in the singular "LED"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

FIG. 1A is an exploded view of an LED lighting system 100A. The illustrated COB LED device lighting system 100A includes a COB assembly 110, an electronics board 120, and an optical holder 130.

The COB assembly 110 may include a COB LED device 112 and a thermally conductive plate 114. The COB LED device 112 may include multiple LED chips disposed on a substrate. At least first and second electrical power contacts 116 may be provided on the substrate. The thermally conductive plate 114 may be formed from a heat conductive metal, such as aluminum or steel, thermally conductive ceramic/metals, or high heat transfer plastics. An aperture 118 may be defined through the thermally conductive plate 114. In an embodiment, the aperture 118 may be sized and/or shaped to accommodate, or conform to, the substrate of the COB LED device 112. Portions of the COB LED device 112 may extend slightly upward and above a plane defined by the thermally conducive plate 114. In certain embodiments, active or passive cooling systems (not shown) may be attached to, or placed near, the thermally conductive plate 114, for example, to help dissipate heat therefrom. These may include active fans, Peltier coolers, heat pipes, heat conductive fins, plates, or rods, or other suitable cooling components.

The COB assembly 110 may be attached to an electronics board 120 using, for example, adhesives, adhesive tape, or other suitable locking engagement, including mechanical interlock. The electronics board 120 may have various electronics disposed thereon, including, but not limited to, power electronics, control electronics, and electronic connectors. Examples the potential electronics that may be provided on the electronics board are described in detail below. The electronics board 120 may also include at least a first and second electrical power contact 126 positioned to align with the first and second electrical power contacts 116, allowing soldering, gold bonding, bonding with a conductive adhesive, or other suitable mechanism to be used for providing permanent electrical interconnect. A circular aperture 122 may be defined in the electronics board 120 (e.g., in a region that overlaps a central axis of the electronics board 120) to allow the portion(s) of the COB LED device 112 extending slightly upward and above the plane defined by the thermally conductive plate 114 to fit in a close contiguous relationship with the electronics board 124.

A standard electronics board used in lighting applications, such as general lighting, may comply with Zhaga specifications that provide for a Zhaga form factor that is 15 mm in diameter and 7 mm in height and provide specific locations for the electrical power contacts. The close contiguous relationship between the COB assembly 110 and the electronics board 120 may enable a modular LED lighting system that provides an LED array and associated electronics in a single, integrated module while fitting within the limited size of the Zhaga form factor. More specifically, the embodiments described herein may provide a 30-40% gain in form factor over conventional LED lighting systems.

An optical holder 130 may optionally be provided over a combination of the COB assembly 110 and the electronics board 120, for example, by attaching the optical holder 130 to at least a region of the electronics board 120. The optical holder 130 may have sidewalls 134 with a height sufficient to accommodate the height of electronic components installed on, and extending upward from, the electronics board 124.

As illustrated in FIG. 1A, an aperture 132 may be defined in the optical holder 130. The aperture 132 may be sized and/or shaped to approximately match, or conform to, the size and/or shape of the light emitting portions of the COB LED device 112. As will be appreciated, however, larger or smaller apertures and different defined shapes may be used for certain applications. The optical holder 130 may also include support structures for attachment of optical elements, such as optical reflectors, lens systems, light guides, protective transparent plates, or colored glass or plastic plates, as needed.

Advantageously, as compared to many conventional COB LED holder systems, bulky clips or mechanical joining systems are not needed to combine the electronics board 120 and the COB assembly 110. In addition, creating room on the electronics board to accommodate multiple fasteners, screws, or nuts to join the electronics board 124 and the thermally conductive plate 114 may not be necessary. Similarly, space may not be required for positioning of vertical or horizontally arranged electrical connectors, electrically conductive springs, or the like, to electrically interconnect the electronic board 124 and the COB assembly 110. Instead, the COB assembly 110 may be directly soldered or otherwise attached to the electronics board 120, providing substantial savings in the height of the completed assembly. As mentioned above, these space savings may translate into more room for electronic components on the electronics board 120, permitting, for example, the addition of wireless, dual channel control, dimmer interface circuitry, a DC power interface, or other electronics. As another advantage, integrating the COB assembly 110 with the electronics board 120 described herein may allow optimization of the electronics board 120 to specific COB assembly 110 types, classes, or models without necessitating a change in COB LED device manufacturing processes. For example, conventional solutions require wider guard bands and protection circuits to allow for a broad range of COB LED device sizes and electrical requirements. Finally, since the optical holder does not need to support any electrical components or interconnects, a wider range of materials and designs may be available for use.

In effect, design freedom and compactness for a COB assembly 100 can be increased, while manufacturing and assembly cost may be decreased, using the various components and assembly techniques described herein. Replacing a wide variety of COB mounting solutions with a matched COB LED device 112 and electronics board 120 can decrease mounting price and increase manufacturing volume. In addition, the size of the electronics board 120 may remain compatible with Zhaga specifications, as mentioned above. Additionally, as mentioned above, more electronics may be included on the electronics board 120. Examples of additional electronic are described below with respect in FIG. 1C.

Figure 1B:
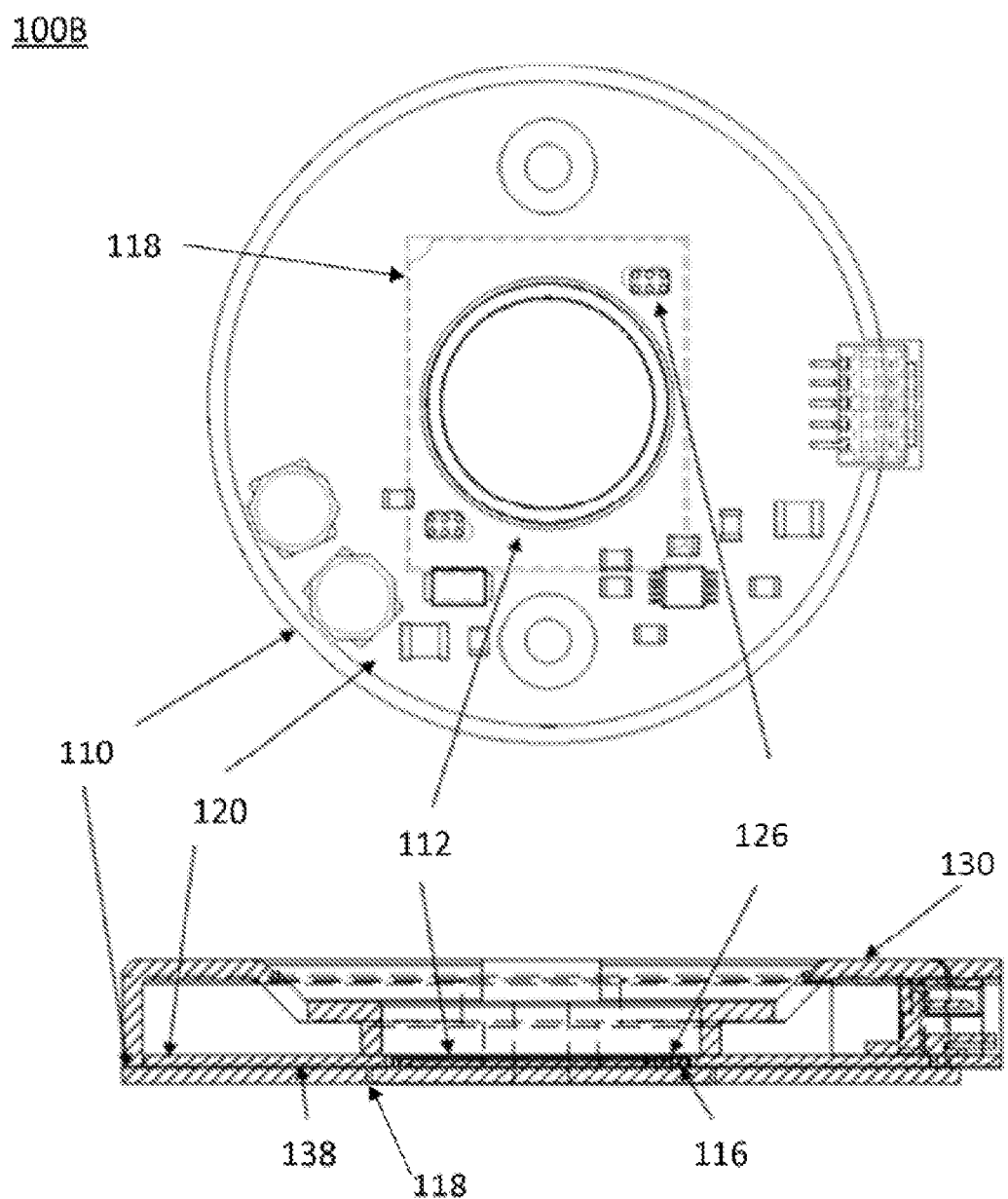
FIG. 1B is a top and cross sectional view an assembled COB LED device lighting system.

FIG. 1B illustrates top and cross-section views of an LED lighting system 100B that includes the COB assembly 110, the electronics board 120 and an optical holder 130. The COB assembly 110 may be attached to the electronics board 120 using, for example, an attachment layer 138. In some instances, the attachment layer 138 includes adhesives, adhesive tape, or other suitable locking engagement, including mechanical interlock.

In the example illustrated in FIG. 1B, a COB LED device 112 has a centrally positioned and slightly protruding light emitting region formed at least partially by the plurality of LED chips. The COB LED device 112 may be fitted into the aperture 118 of the COB assembly 110. This positioning may bring the electrical power contacts 116 on the COB LED device 112 and the electrical power contacts 126 on the electronics board 120 into close contact, allowing soldering or other electrical coupling to be made without substantially increasing the vertical height of the system. In some instances, the positions of the electrical power contacts 116 may be limited by the Zhaga specification. The optical holder 130 may be vertically sized to accommodate electronics attached to the electronics board 120 and may also be configured to hold optical elements as needed.

In some instances, the COB LED device 112 may receive power via an AC or DC power module provided on the electronics board 120. By incorporating the power module onto the electronics board 120, the LED lighting system 100B may be able to maximize the space utilization while still complying with Zhaga specifications. For example, in some embodiments, the power module may include on-board AC/DC and DC-DC converter circuits, which may provide DC current to the COB LED device 112 or a dimmer interface circuit (described in detail below). Examples of how these circuits may be incorporated onto the electronics board 120 are described below with respect to FIG. 1C.

Figure 1C:
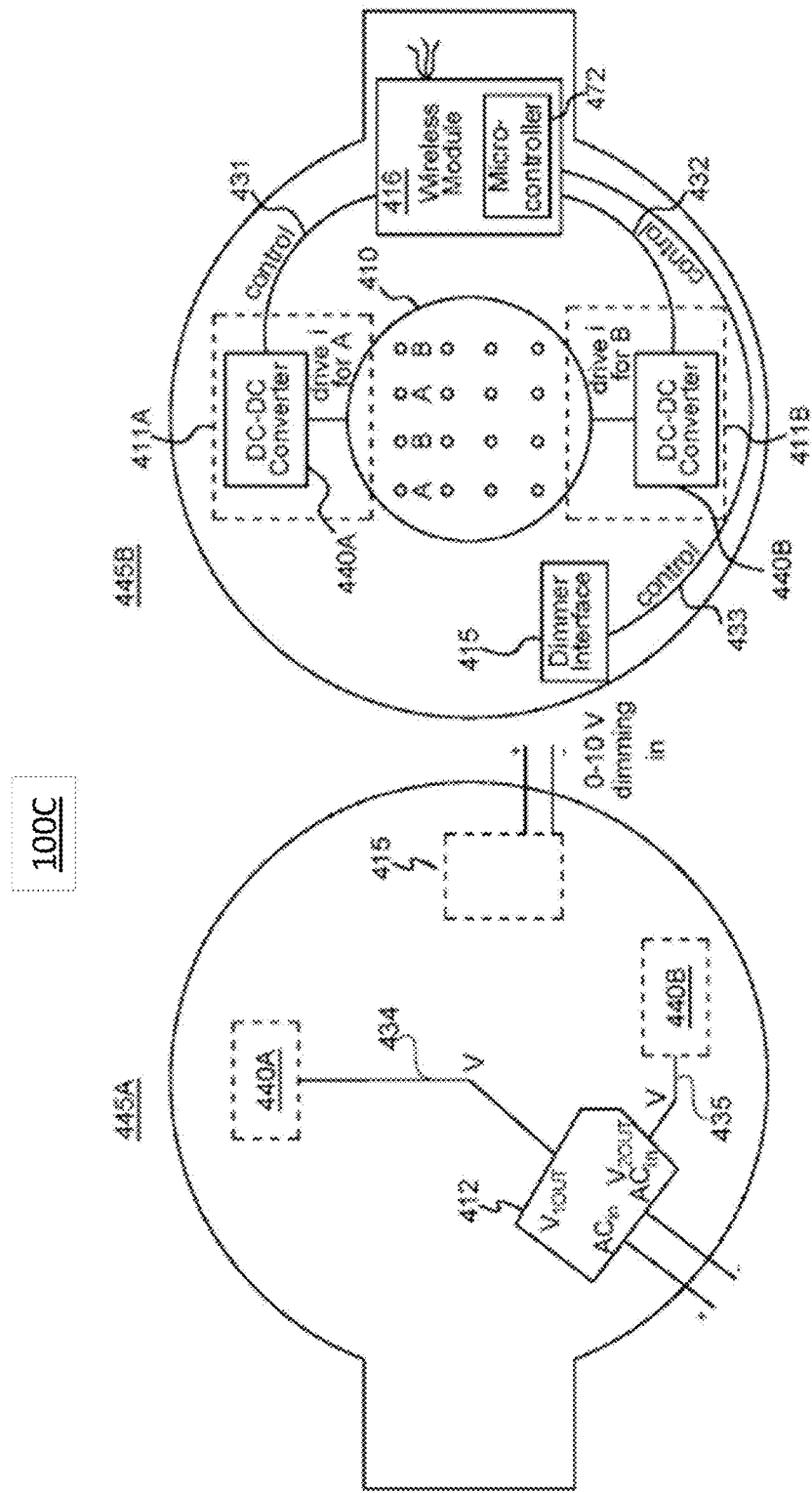
FIG. 1C is a diagram of one embodiment of a two channel integrated LED lighting system with electronic components mounted on two surfaces of a circuit board.

FIG. 1C illustrates one embodiment of a two channel integrated LED lighting system 100C that may incorporate embodiments described herein. The illustrated two channel integrated LED lighting system 100C includes a first surface 445A having inputs to receive dimmer signals and AC power signals and an AC/DC converter circuit 412 mounted on it. The two channel integrated LED lighting system 100C includes a second surface 445B with a dimmer interface circuit 415, DC-DC converter circuits 440A and 440B, a connectivity and control module 416 (a wireless module in this example) having a microcontroller 472, and an LED array 410 mounted on it. The LED array 410, which may be the COB LED device 112, is driven by two independent channels 411A and 411B. In alternative embodiments, a single channel may be used to provide the drive signals to an LED array, or any number of multiple channels may be used to provide the drive signals to an LED array. For example, FIG. 3D illustrates an LED lighting system 400D having 3 channels and is described in further detail below.

The LED array 410, which may be the COB LED 112, may include two groups of LED devices. In an example embodiment, the LED devices of group A are electrically coupled to a first channel 411A and the LED devices of group B are electrically coupled to a second channel 411B. Each of the two DC-DC converter circuits 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC-DC converter circuits 440A and 440B via a single channel 411A and 411B, respectively. Although the embodiment shown in FIG. 1C does not include a sensor module (as described in FIG. 2 and FIG. 3A), an alternative embodiment may include a sensor module.

The illustrated two channel integrated LED lighting system 100C is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

Figure 1D:
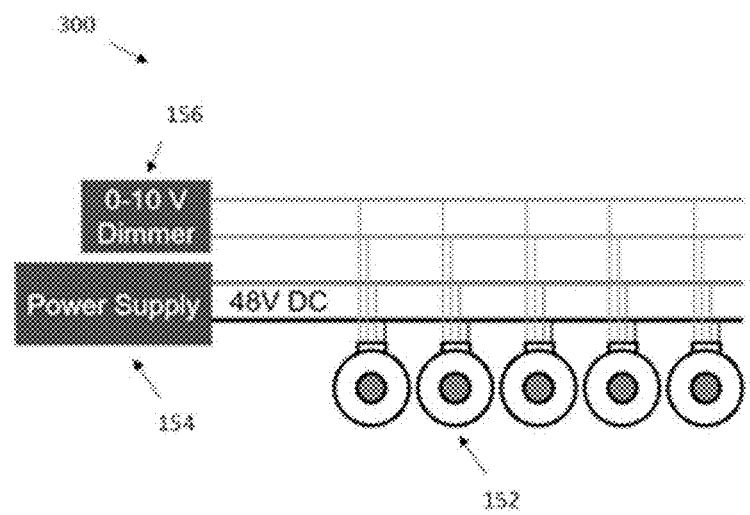
FIG. 1D is diagram of an embodiment of a power system for multiple COB LED devices as described herein.

FIG. 1D illustrates an LED lighting system 300 including multiple COB LED device sub-systems 152 that may be electrically interconnected and powered by an external DC power supply 154. Light intensity from the multiple COB LED device sub-systems 152 may be controlled with an external dimmer actuator 156. External dimmer actuator 156 is connected to electronics board electronics (not shown, although discussed with respect to at least FIGS. 1A-C) associated with each COB LED device sub-system 152. Space within the Zhaga form factor created by the reduction in space saved by the embodiments described herein may be used for the inclusion of a dimmer interface (illustrated in FIG. 1C) that receives 0-10 volt inputs from external dimmer actuator 156 and any circuitry required to receive the external DC voltage. Advantageously, the use of an external DC power supply can reduce costs as compared to individually driving COB LED devices with separate AC powered dimmable drivers.

Figure 1E:
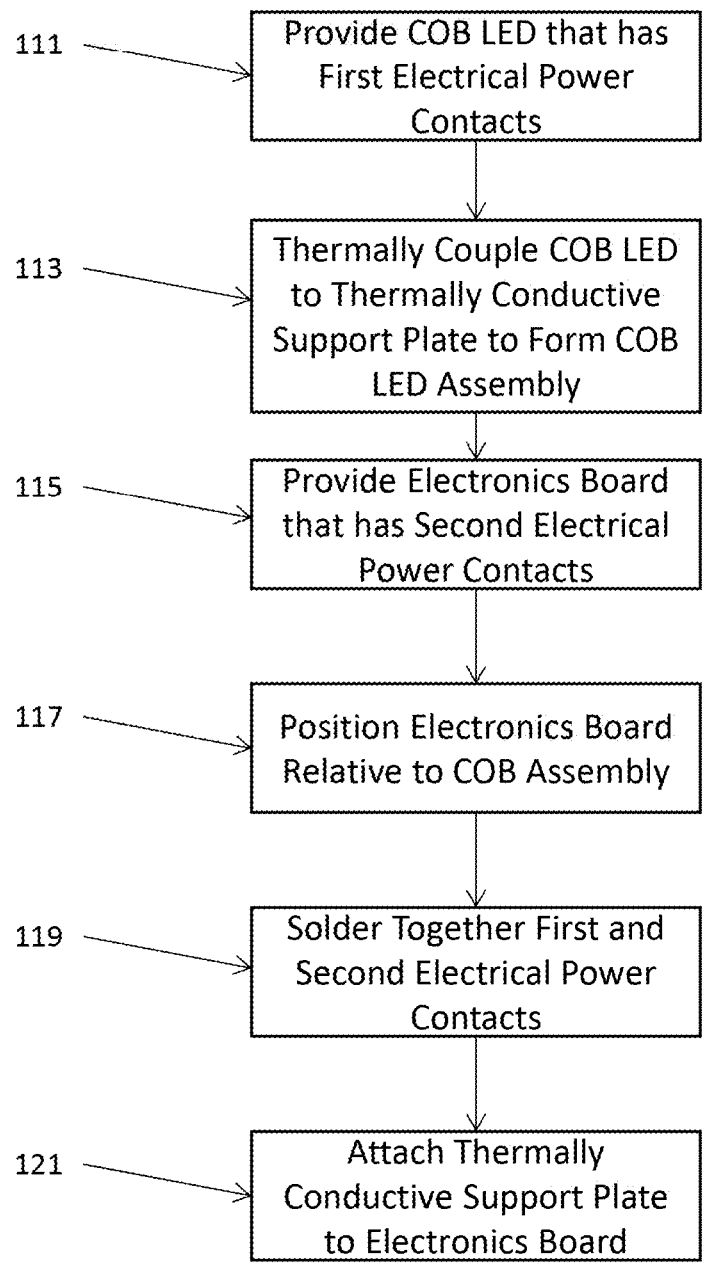
FIG. 1E is a flow diagram of a method of manufacturing a COB LED device lighting system.

FIG. 1E is a flow diagram of a method 123 of manufacturing a COB LED lighting system. In the example illustrated in FIG. 1D, a COB LED device is provided (111). The COB LED device may include multiple LED chips disposed on a surface of substrate. The substrate may include first electrical power contacts exposed from at least the surface. The COB LED device may be thermally coupled to a thermally conductive plate to form a COB assembly (113). In some instances, the COB assembly may be formed by attaching the COB LED device to a central region of the thermally conductive plate. In embodiments where the thermally conductive plate includes an aperture, the attaching may be performed by fitting the COB LED device in the aperture so that at least a portion of the COB LED device extends above a surface of the thermally conductive plate.

An electronics board may be provided (115) and positioned relative to the COB assembly such that the electrical power contacts on the COB LED device and electrical power contacts of the electronics board are aligned (117). The electrical power contacts of the COB LED device and the electrical power contacts of the electronics board may be soldered together (119). The thermally conductive plate may be attached to the electronics board (121). In some embodiments, the thermally conductive plate is attached to the electronics board using adhesives, adhesive tape, or other suitable locking engagement, including a mechanical interlock.

Optionally, an optical holder may be attached to the electronics board. In some embodiments, the optic holder may be attached to the electronics board using adhesives, adhesive tape, or other suitable locking engagement, including a mechanical interlock.

FIG. 1E illustrate six steps for manufacturing a COB LED system. One of ordinary skill in the art will understand, however, that more or less steps can be involved. Additionally, any of the steps may be combined to be performed at the same time. The order of these steps can also be altered such that any one or more of the steps are performed in a different sequence than illustrated in FIG. 1E.

Additional electronics boards and LED lighting systems are described below with respect to FIGS. 2, 3A, 3B, 3C and 3D. In some embodiments, the LED array, which may be the COB LED device described herein, is provided on the same electronics board as all of the associated electrical and electronic circuitry. In other embodiments, some of the associated electrical and electronic circuitry is provided on a separate board. One of ordinary skill in the art will recognize that different arrangements of the electronics boards and systems are possible within the scope of the embodiments described herein.

Figure 2:
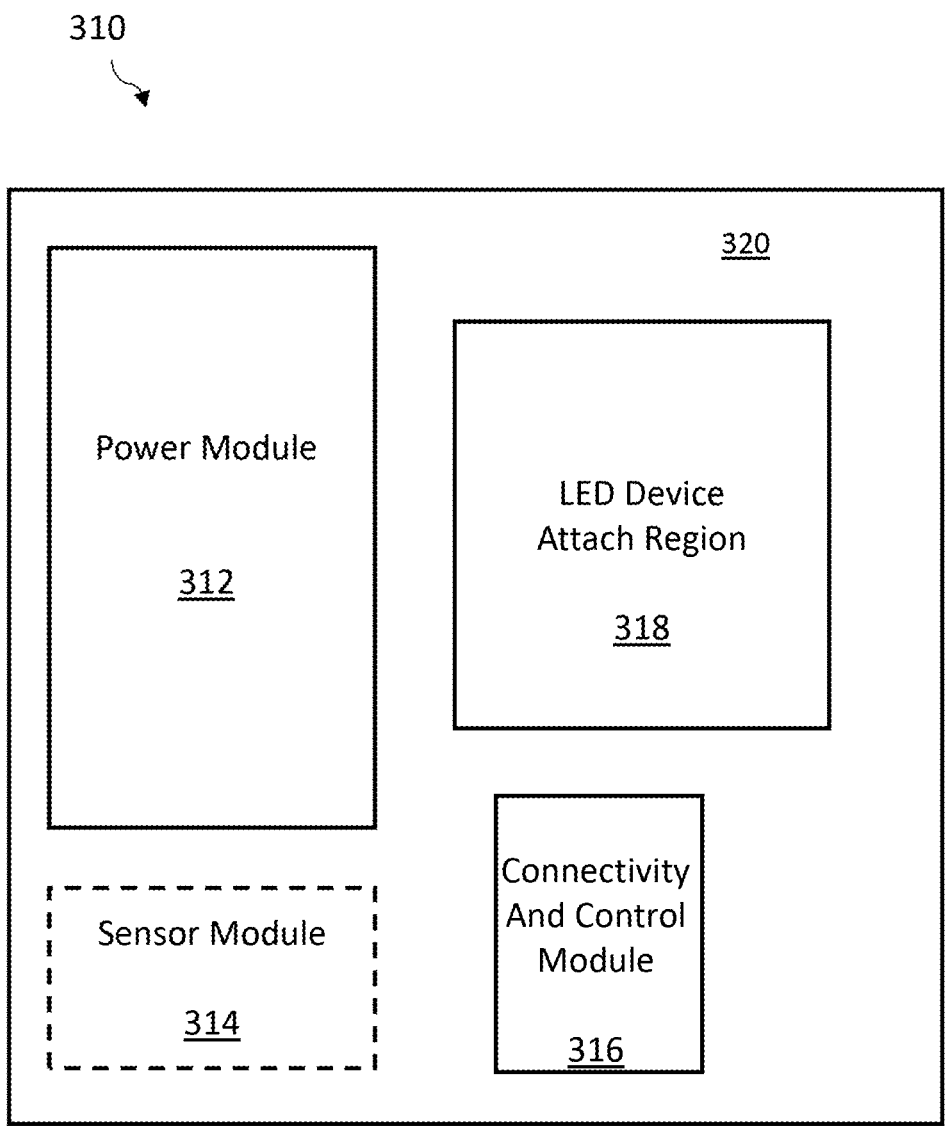
FIG. 2 is a top view of an electronics board for an integrated LED lighting system according to one embodiment.

FIG. 2 is a top view of an electronics board 310 for an integrated LED lighting system according to one embodiment. In alternative embodiments, two or more electronics boards may be used for the LED lighting system. For example, the LED array may be on a separate electronics board, or the sensor module may be on a separate electronics board. In the illustrated example, the electronics board 310 includes a power module 312, a sensor module 314, a connectivity and control module 316 and an LED attach region 318 reserved for attachment of an LED array to a substrate 320.

The substrate 320 may be any board capable of mechanically supporting, and providing electrical coupling to, electrical components, electronic components and/or electronic modules using conductive connecters, such as tracks, traces, pads, vias, and/or wires. The substrate 320 may include one or more metallization layers disposed between, or on, one or more layers of non-conductive material, such as a dielectric composite material. The power module 312 may include electrical and/or electronic elements. In an example embodiment, the power module 312 includes an AC/DC conversion circuit, a DC-DC converter circuit, a dimming circuit, and an LED driver circuit.

The sensor module 314 may include sensors needed for an application in which the LED array is to be implemented. Example sensors may include optical sensors (e.g., IR sensors and image sensors), motion sensors, thermal sensors, mechanical sensors, proximity sensors, or even timers. By way of example, LEDs in street lighting, general illumination, and horticultural lighting applications may be turned off/on and/or adjusted based on a number of different sensor inputs, such as a detected presence of a user, detected ambient lighting conditions, detected weather conditions, or based on time of day/night. This may include, for example, adjusting the intensity of light output, the shape of light output, the color of light output, and/or turning the lights on or off to conserve energy. For AR/VR applications, motion sensors may be used to detect user movement. The motion sensors themselves may be LEDs, such as IR detector LEDs. By way of another example, for camera flash applications, image and/or other optical sensors or pixels may be used to measure lighting for a scene to be captured so that the flash lighting color, intensity illumination pattern, and/or shape may be optimally calibrated. In alternative embodiments, the electronics board 310 does not include a sensor module.

The connectivity and control module 316 may include the system microcontroller and any type of wired or wireless module configured to receive a control input from an external device. By way of example, a wireless module may include blue tooth, Zigbee, Z-wave, mesh, WiFi, near field communication (NFC) and/or peer to peer modules may be used. The microcontroller may be any type of special purpose computer or processor that may be embedded in an LED lighting system and configured or configurable to receive inputs from the wired or wireless module or other modules in the LED system (such as sensor data and data fed back from the LED module) and provide control signals to other modules based thereon. Algorithms implemented by the special purpose processor may be implemented in a computer program, software, or firmware incorporated in a non-transitory computer-readable storage medium for execution by the special purpose processor. Examples of non-transitory computer-readable storage mediums include a read only memory (ROM), a random access memory (RAM), a register, cache memory, and semiconductor memory devices. The memory may be included as part of the microcontroller or may be implemented elsewhere, either on or off the electronics board 310.

The term module, as used herein, may refer to electrical and/or electronic components disposed on individual circuit boards that may be soldered to one or more electronics boards 310. The term module may, however, also refer to electrical and/or electronic components that provide similar functionality, but which may be individually soldered to one or more circuit boards in a same region or in different regions.

Figure 3A:
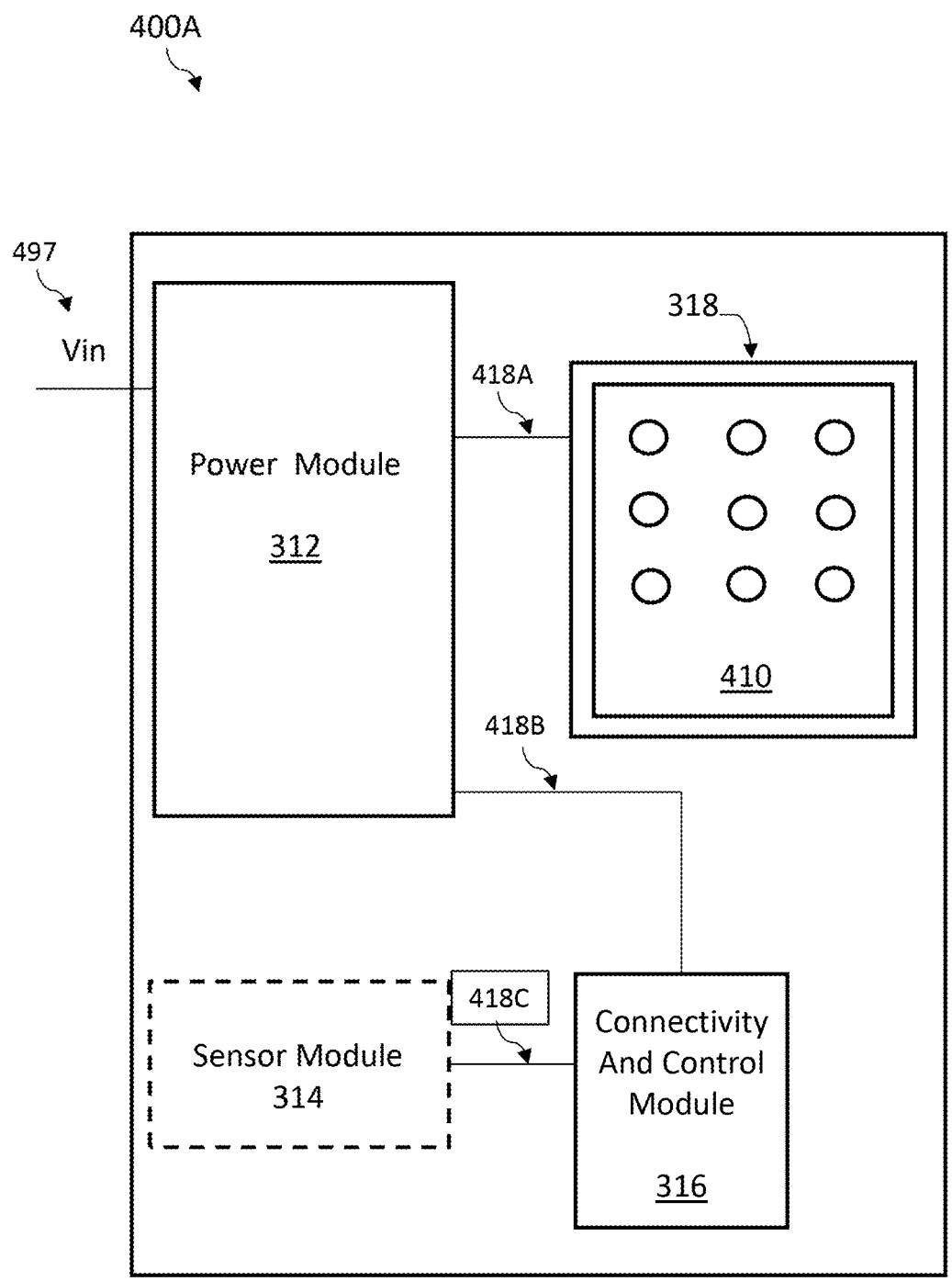
FIG. 3A is a top view of the electronics board with LED array attached to the substrate at the LED device attach region in one embodiment.

FIG. 3A is a top view of the electronics board 310 with an LED array 410 attached to the substrate 320 at the LED device attach region 318 in one embodiment. The electronics board 310 together with the LED array 410 represents an LED lighting system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 3A, the connectivity and control module 316 receives sensor signals from the sensor module 314 over traces 418.

Figure 3B:
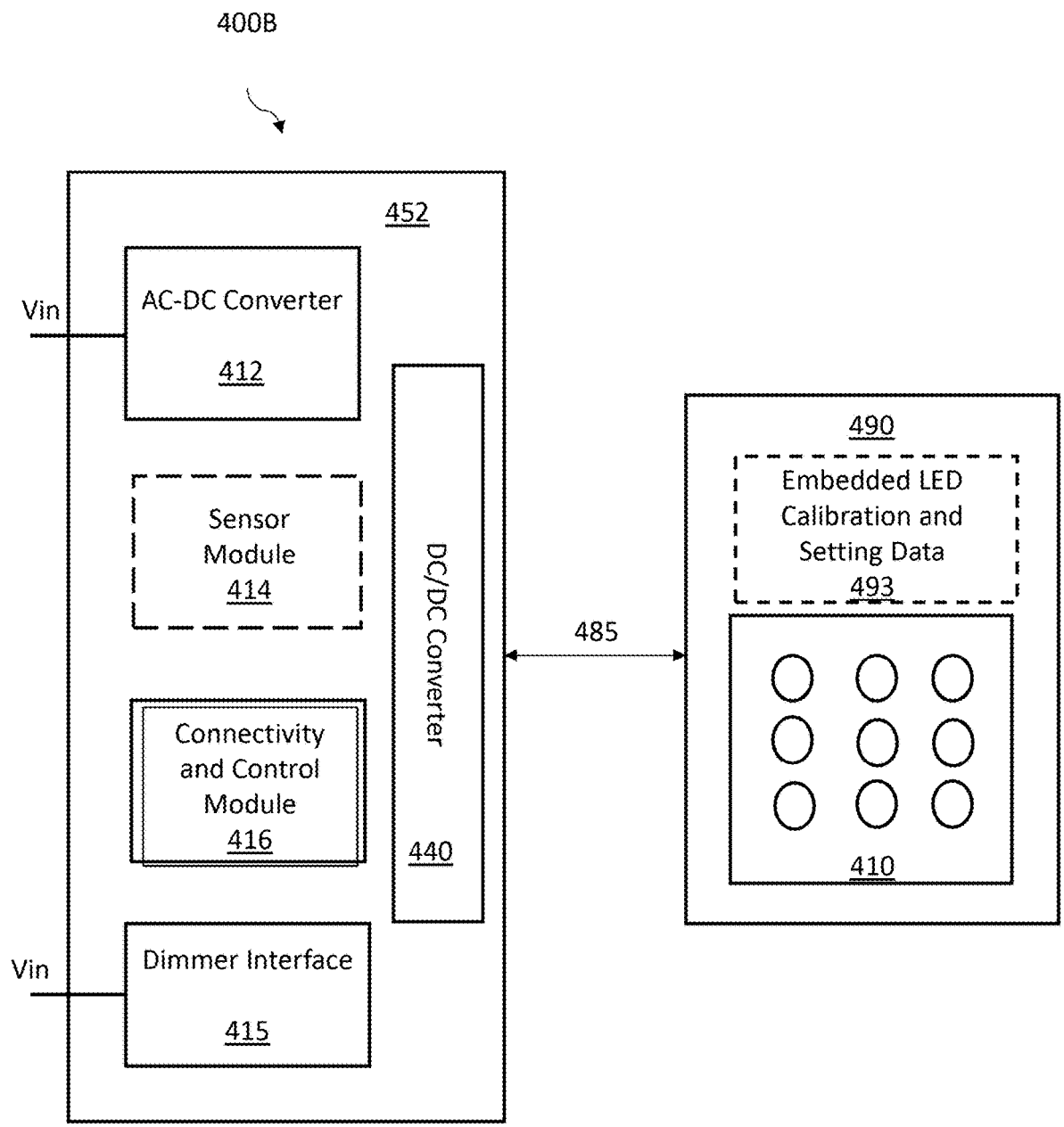
FIG. 3B is a diagram of an embodiment of an LED lighting system where the LED array is on a separate electronics board from the driver and control circuitry.

FIG. 3B illustrates an embodiment of an LED lighting system where the LED array is on a separate electronics board from the driver and control circuitry. The LED lighting system 400B includes a power module 452 that is on a separate electronics board than an LED module 490. The power module 452 may include, on a first electronics board, an AC/DC converter circuit 412, a sensor module 414, a connectivity and control module 416, a dimmer interface circuit 415 and a DC-DC converter circuit 440. The LED module 490 may include, on a second electronics board, embedded LED calibration and setting data 493 and the LED array 410. Data, control signals and/or LED driver input signals 485 may be exchanged between the power module 452 and the LED module 490 via wires that may electrically and communicatively couple the two modules. The embedded LED calibration and setting data 493 may include any data needed by other modules within a given LED lighting system to control how the LEDs in the LED array are driven. In one embodiment, the embedded calibration and setting data 493 may include data needed by the microcontroller to generate or modify a control signal that instructs the driver to provide power to each group of LEDs A and B using, for example, pulse width modulated (PWM) signals. In this example, the calibration and setting data 493 may inform the microcontroller 472 as to, for example, the number of power channels to be used, a desired color point of the composite light to be provided by the entire LED array 410, and/or a percentage of the power provided by the AC/DC converter circuit 412 to provide to each channel.

Figure 3C:
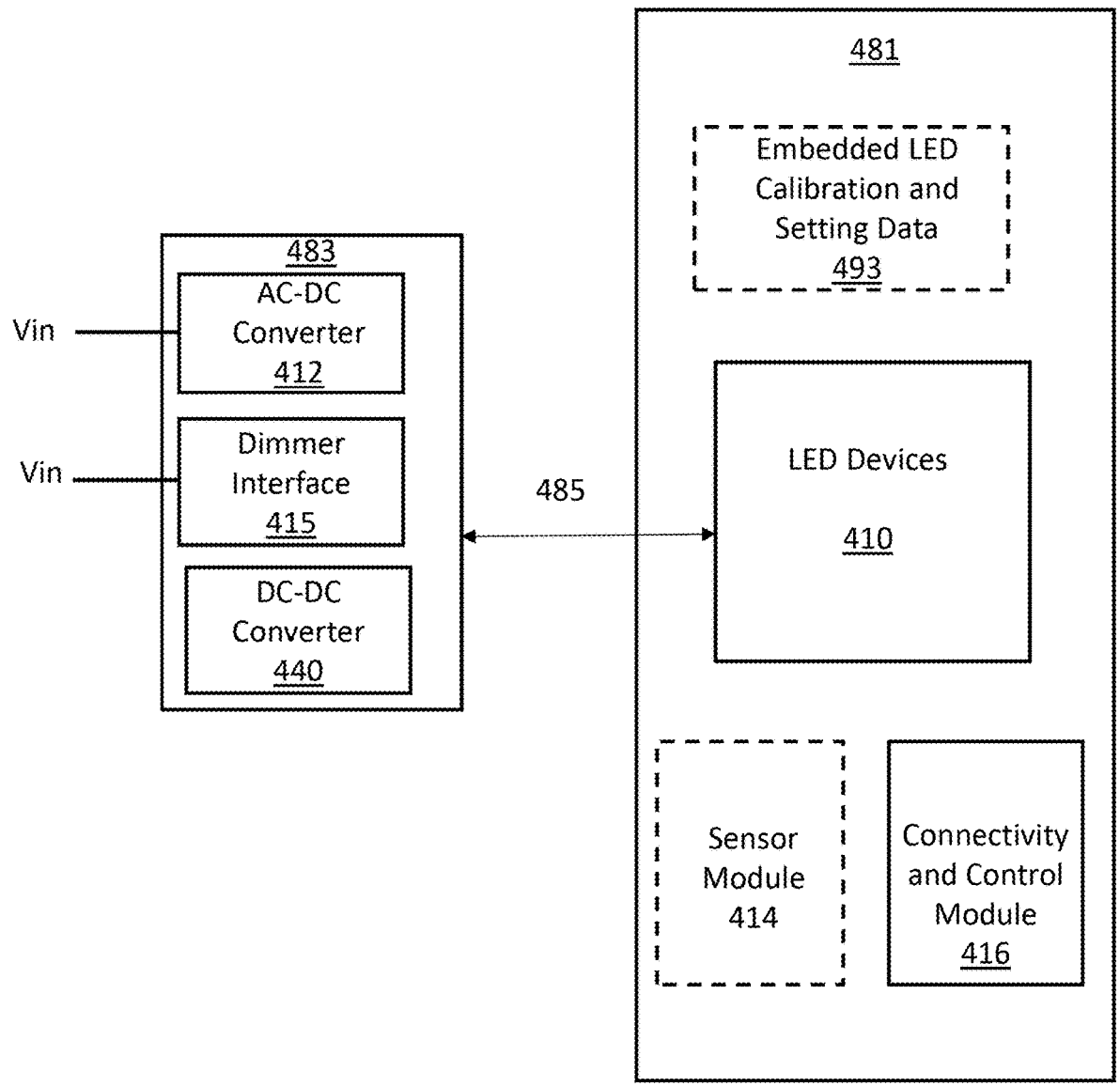
FIG. 3C is a block diagram of an LED lighting system having the LED array together with some of the electronics on an electronics board separate from the driver circuit.
Figure 3D:
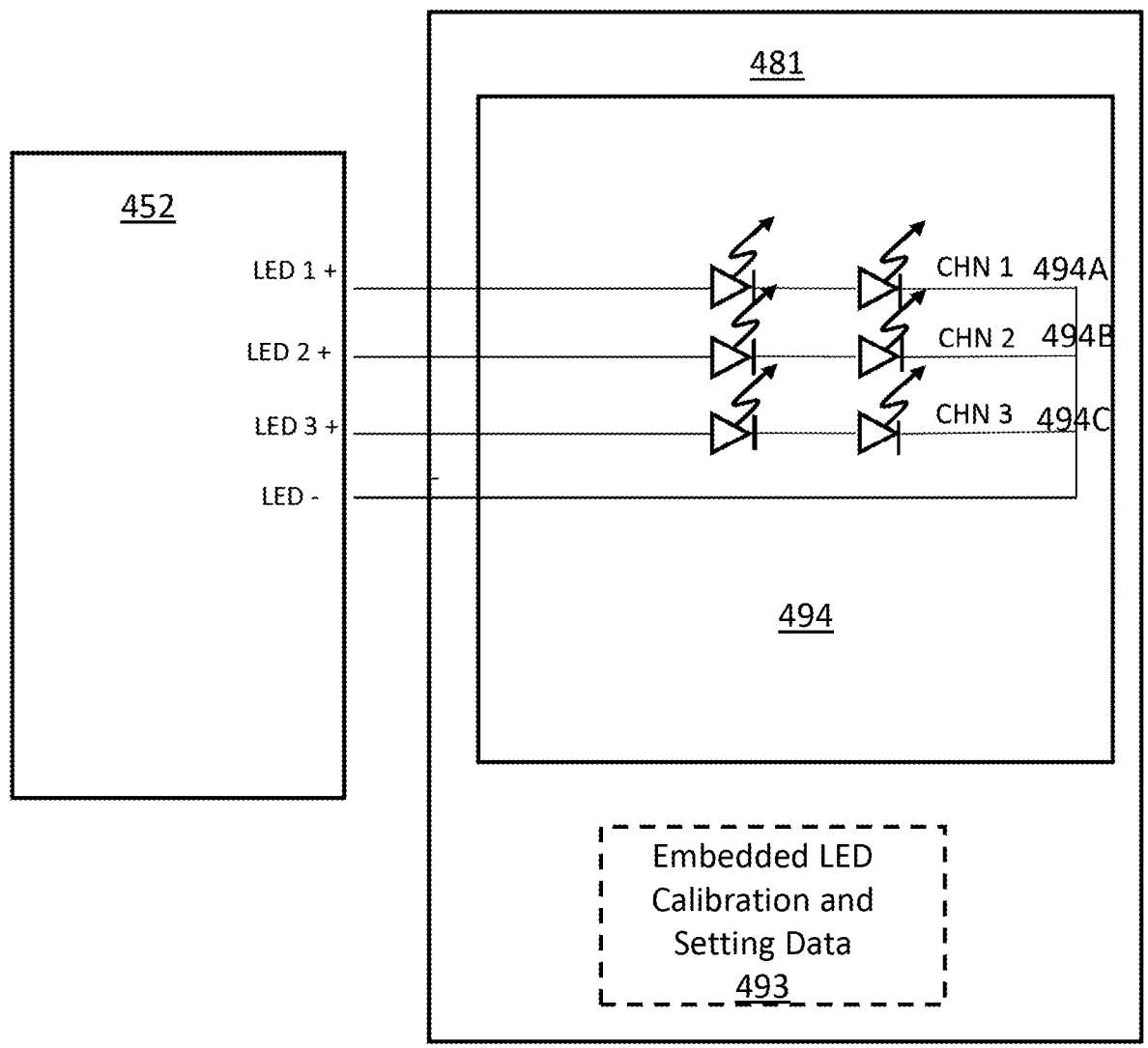
FIG. 3D is a diagram of example LED lighting system showing a multi-channel LED driver circuit.

FIG. 3C illustrates a block diagram of an LED lighting system having the LED array together with some of the electronics on an electronics board separate from the driver circuit. An LED system 400C includes a power conversion module 483 and an LED module 481 located on a separate electronics board. The power conversion module 483 may include the AC/DC converter circuit 412, the dimmer interface circuit 415 and the DC-DC converter circuit 440, and the LED module 481 may include the embedded LED calibration and setting data 493, LED array 410, sensor module 414 and connectivity and control module 416. The power conversion module 483 may provide LED driver input signals 485 to the LED array 410 via a wired connection between the two electronics boards.

FIG. 3D is a diagram of an example LED lighting system 400D showing a multi-channel LED driver circuit. In the illustrated example, the system 400D includes a power module 452 and an LED module 481 that includes the embedded LED calibration and setting data 493 and three groups of LEDs 494A, 494B and 494C. While three groups of LEDs are shown in FIG. 3D, one of ordinary skill in the art will recognize that any number of groups of LEDs may be used consistent with the embodiments described herein. Further, while the individual LEDs within each group are arranged in series, they may be arranged in parallel in some embodiments.

The LED array 491 may include groups of LEDs that provide light having different color points. For example, the LED array 491 may include a warm white light source via a first group of LEDs 494A, a cool white light source via a second group of LEDs 494B and a neutral while light source via a third group of LEDs 494C. The warm white light source via the first group of LEDs 494A may include one or more LEDs that are configured to provide white light having a correlated color temperature (CCT) of approximately 2700K. The cool white light source via the second group of LEDs 494B may include one or more LEDs that are configured to provide white light having a CCT of approximately 6500K. The neutral white light source via the third group of LEDs 494C may include one or more LEDs configured to provide light having a CCT of approximately 4000K. While various white colored LEDs are described in this example, one of ordinary skill in the art will recognize that other color combinations are possible consistent with the embodiments described herein to provide a composite light output from the LED array 491 that has various overall colors.

The power module 452 may include a tunable light engine (not shown), which may be configured to supply power to the LED array 491 over three separate channels (indicated as LED1+, LED2+ and LED3+ in FIG. 3E). More particularly, the tunable light engine may be configured to supply a first PWM signal to the first group of LEDs 494A such as warm white light source via a first channel, a second PWM signal to the second group of LEDs 494B via a second channel, and a third PWM signal to the third group of LEDs 494C via a third channel. Each signal provided via a respective channel may be used to power the corresponding LED or group of LEDs, and the duty cycle of the signal may determine the overall duration of on and off states of each respective LED. The duration of the on and off states may result in an overall light effect which may have light properties (e.g., correlated color temperature (CCT), color point or brightness) based on the duration. In operation, the tunable light engine may change the relative magnitude of the duty cycles of the first, second and third signals to adjust the respective light properties of each of the groups of LEDs to provide a composite light with the desired emission from the LED array 491. As noted above, the light output of the LED array 491 may have a color point that is based on the combination (e.g., mix) of the light emissions from each of the groups of LEDs 494A, 494B and 494C.

In operation, the power module 452 may receive a control input generated based on user and/or sensor input and provide signals via the individual channels to control the composite color of light output by the LED array 491 based on the control input. In some embodiments, a user may provide input to the LED system for control of the DC-DC converter circuit by turning a knob or moving a slider that may be part of, for example, a sensor module (not shown). Additionally or alternatively, in some embodiments, a user may provide input to the LED lighting system 400D using a smartphone and/or other electronic device to transmit an indication of a desired color to a wireless module (not shown).

Figure 4:
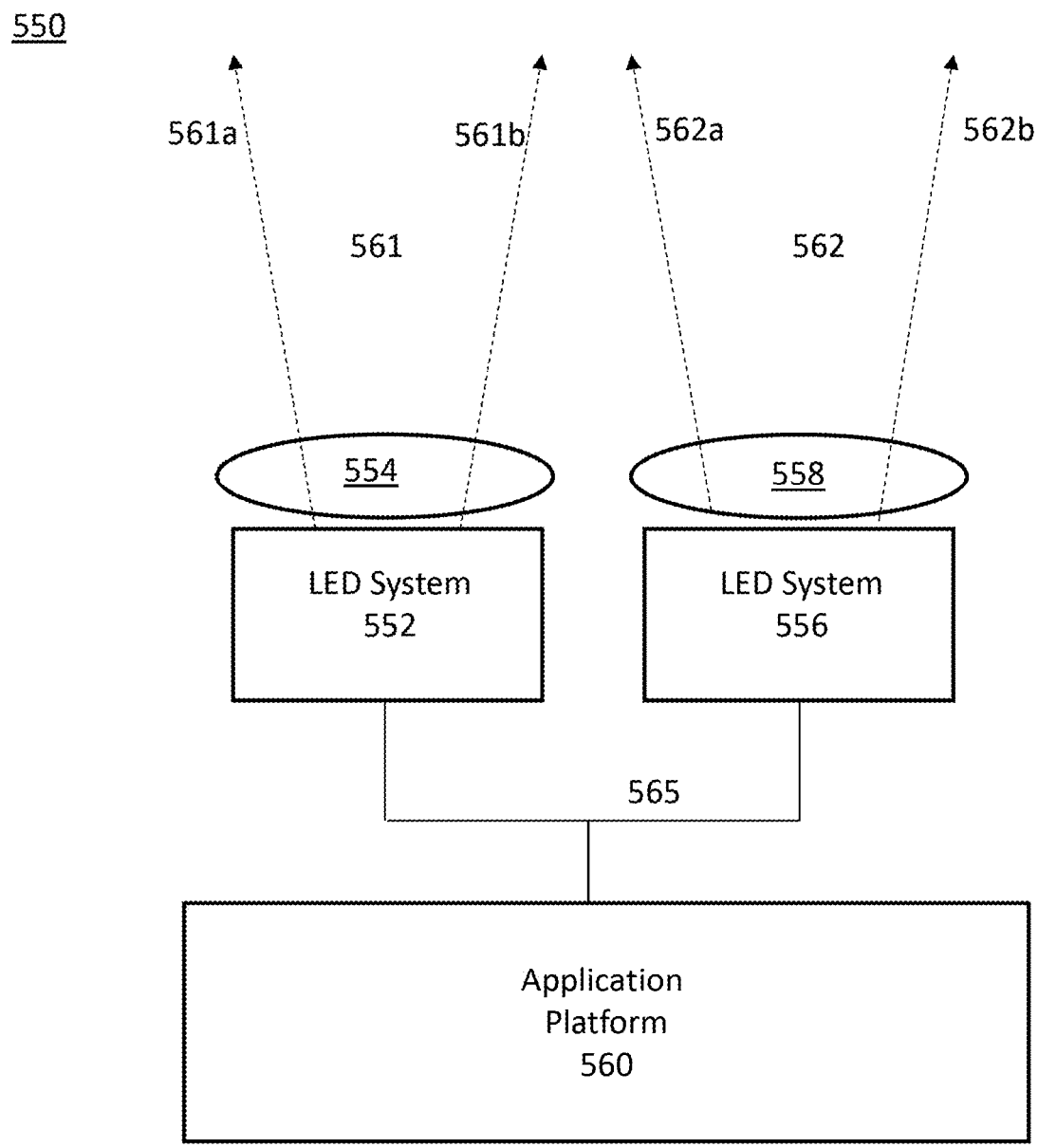
FIG. 4 is a diagram of an example application system.

FIG. 4 shows an example system 550 which includes an application platform 560, LED lighting systems 552 and 556, and secondary optics 554 and 558. The LED lighting system 552 produces light beams 561 shown between arrows 561a and 561b. The LED lighting system 556 may produce light beams 562 between arrows 562a and 562b. In the embodiment shown in FIG. 4, the light emitted from LED lighting system 552 passes through secondary optics 554, and the light emitted from the LED lighting system 556 passes through secondary optics 558. In alternative embodiments, the light beams 561 and 562 do not pass through any secondary optics. The secondary optics may be or may include one or more light guides. The one or more light guides may be edge lit or may have an interior opening that defines an interior edge of the light guide. LED lighting systems 552 and/or 556 may be inserted in the interior openings of the one or more light guides such that they inject light into the interior edge (interior opening light guide) or exterior edge (edge lit light guide) of the one or more light guides. LEDs in LED lighting systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED lighting systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The integrated LED lighting systems shown in FIGS. 1A, 1B, 10, 3A, 3B, 3C and 3D illustrate LED lighting systems 552 and 556 in example embodiments.

In example embodiments, the system 550 may be a mobile phone of a camera flash system, indoor residential or commercial lighting, outdoor light such as street lighting, an automobile, a medical device, AR/VR devices, and robotic devices. The integrated LED lighting systems shown in FIGS. 1A, 1B, 10, 3A, 3B, 3C and 3D illustrate LED lighting systems 552 and 556 in example embodiments.

The application platform 560 may provide power to the LED lighting systems 552 and/or 556 via a power bus via line 565 or other applicable input, as discussed herein. Further, application platform 560 may provide input signals via line 565 for the operation of the LED lighting system 552 and LED lighting system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED lighting system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED lighting system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In an example embodiment, application platform 560 may represent an automobile and LED lighting system 552 and LED lighting system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED lighting systems 552 and/or 556 may be sensors that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A system comprising:
    a chip-on-board (COB) assembly including:
        a thermally conductive plate, and
        a COB light-emitting diode (LED) device including a plurality of LED chips disposed on a surface of a substrate, the substrate including first electrical power contacts exposed from at least the surface,
        the COB LED device being thermally coupled to the thermally conductive plate; and
    an electronics board having second electrical power contacts, the electronics board being attached to the COB assembly with the first and second electrical power contacts electrically coupled and the electronics board disposed on the thermally conductive plate and at least partially covering the surface of the substrate of the COB LED.

2. The system of claim 1, wherein the COB LED device is attached to a central region of the thermally conductive plate.

3. The system of claim 1, further comprising an aperture formed in the thermally conductive plate and having a shape conforming to a shape of the COB LED device substrate, the COB LED device being fitted within the aperture such that a light emitting region, formed at least partially by the plurality of LED chips, extends above a surface of the thermally conductive plate to which the electronics board is attached.

4. The system of claim 3, further comprising an aperture formed in a central region of the electronics board through which the light emitting region at least partially extends.

5. The system of claim 1, further comprising a plurality of electronic elements disposed on the electronics board, the plurality of electronic elements including at least one of a dimmer interface circuit, one or more direct current (DC)-DC converter circuits, a conductivity and control module and an alternating current (AC)-DC converter circuit.

6. The system of claim 1, further comprising an optical holder attached to the electronics board.

7. The system of claim 6, wherein the optical holder includes at least one support structure configured for attachment of at least one of an optical reflector, a lens system, a light guide, a protective transparent plate, a colored glass, and a plastic plate.

8. The system of claim 1, further comprising at least one active or passive cooling element disposed on or adjacent to the thermally conductive plate.

9. A system comprising:
    a plurality of chip-on-board (COB) light-emitting diode (LED) device sub-systems, each of the plurality of COB LED device sub-systems comprising:
        a COB assembly including a thermally conductive plate and a COB LED device thermally coupled to the thermally conductive plate, the COB LED device including a plurality of LED chips disposed on a surface of a substrate, the substrate including first electrical power contacts exposed from at least the surface,
        an electronics board having second electrical power contacts, the electronics board being attached to the COB assembly with the first and second electrical power contacts electrically coupled and the electronics board disposed on the thermally conductive plate and at least partially covering the surface of the substrate of the COB LED, and
        a direct current (DC) voltage interface configured to receive a DC voltage from a single external DC power supply.

10. The system of claim 9, further comprising dimmer interface circuitry configured to receive a DC voltage from a single external dimmer actuator.

11. The system of claim 10, wherein each of the plurality of COB LED device sub-systems further comprises individual dimmer interface circuits electrically coupled to the single external dimmer actuator.

12. The system of claim 9, wherein the COB LED device of each of the COB LED device sub-systems is attached to a central region of the respective thermally conductive plate.

13. A method of assembling a chip-on-board (COB) light-emitting diode (LED) device system, the method comprising:
    providing a COB LED device that includes a plurality of LED chips disposed on a surface of a substrate, the substrate including first electrical power contacts exposed from at least the surface;
    thermally coupling the COB LED device to a thermally conductive plate to form a COB assembly;
    providing an electronics board having second electrical power contacts;

positioning the electronics board relative to the COB assembly such that the first and second electrical power contacts are aligned;

soldering together the first and second electrical power contacts; and attaching the thermally conductive plate to the electronics board with the electronics board disposed on the thermally conductive plate and at least partially covering the surface of the substrate of the COB LED.

14. The method of claim 13, wherein the attaching the thermally conductive plate to the electronics board comprises attaching the thermally conductive plate to the electronics board using an adhesive.

15. The method of claim 13, wherein the thermally coupling the COB LED device to the thermally conductive plate comprises attaching the COB LED device to a central region of the thermally conductive plate.

16. The method of claim 13, wherein the provided thermally conductive plate comprises an aperture having a shape that conforms to a shape of the COB LED device substrate, and the positioning includes fitting the COB LED device within the aperture such that a light emitting region, formed at least partially by the plurality of LED chips, extends above a surface of the thermally conductive plate to which the electronics board is attached.

17. The method of claim 16, wherein the electronics board further comprises an aperture formed in a central region thereof, the method further comprising at least partially extending the light emitting region through the aperture formed in the central region of the electronics board.

18. The method of claim 13, further comprising attaching an optical holder to the electronics board.

19. The method of claim 13, further comprising providing electronic elements on the electronics board, the electronic elements including at least one of a dimmer interface circuit, one or more direct current (DC)-DC converter circuits, a conductivity and control module and an alternating current (AC)-DC converter circuit.

20. The method of claim 13, further comprising providing at least one active or passive cooling element on or adjacent to the thermally conductive plate.

* * * * *